United States Patent [19]

Horiguchi et al.

[11] Patent Number: 4,726,021
[45] Date of Patent: Feb. 16, 1988

[54] SEMICONDUCTOR MEMORY HAVING ERROR CORRECTING MEANS

[75] Inventors: Masashi Horiguchi, Kokubunji; Masakazu Aoki, Tokorozawa; Yoshinobu Nakagome, Hachioji; Shinichi Ikenaga, Kokubunji; Katsuhiro Shimohigashi, Musashimurayama, all of Japan

[73] Assignee: Hitachi, Ltd., Tokyo, Japan

[21] Appl. No.: 853,230

[22] Filed: Apr. 17, 1986

[30] Foreign Application Priority Data

Apr. 17, 1985 [JP] Japan .................................. 60-80155
Jun. 26, 1985 [JP] Japan .................................. 60-139792

[51] Int. Cl.$^4$ ........................ G06F 11/10; G01R 31/28
[52] U.S. Cl. .......................................... 371/38; 371/21
[58] Field of Search ............................. 371/38, 21, 13

[56] References Cited

U.S. PATENT DOCUMENTS

| | | | |
|---|---|---|---|
| 3,836,957 | 9/1974 | Duke et al. ........................... | 371/38 |
| 4,048,481 | 9/1977 | Bailey, Jr. et al. ................... | 371/16 |
| 4,359,771 | 11/1982 | Johnson et al. ..................... | 371/38 X |
| 4,365,332 | 12/1982 | Rice ..................................... | 371/13 |
| 4,380,071 | 4/1983 | Odaka ................................. | 371/38 X |
| 4,388,684 | 6/1983 | Nibby, Jr. et al. ................... | 364/200 |
| 4,410,988 | 10/1983 | Suelflow et al. ...................... | 371/38 |

Primary Examiner—Charles E. Atkinson
Attorney, Agent, or Firm—Antonelli, Terry & Wands

[57] ABSTRACT

A semiconductor memory having an error correcting function is provided, which has a device by which the user finds no difficulty in making use of the semiconductor memory and can test it with ease. In the semiconductor memory, a signal indicative of the completion of the preparation for reading/writing is outputted from the memory so that the user, after detecting the output of this signal, performs reading/writing data. To facilitate tests, such as a memory cell test for a redundant bit (check bit), an encoding circuit test and a decoding circuit test, the present invention provides that the arranged tests can be made independently of each other.

12 Claims, 23 Drawing Figures

SEMICONDUCTOR MEMORY HAVING ERROR CORRECTING MEANS

BACKGROUND OF THE INVENTION

The present invention relates to a semiconductor memory and more particularly to a semiconductor memory having error correcting means using an error correcting code.

As a measure to cope with errors, there is known a method in which a redundant bit (check bit) for an error correcting code (hereinafter abbreviated as ECC) is added and encoding and decoding circuits are provided on the chip of a semiconductor memory to correct data, as disclosed in Yamada, J., et al. "A submicron VLSI Memory with a 4b-at-a-Time Built in ECC Circuit" ISSCC digest of Technical Papers, pp. 104–105. Feb. 1984.

With respect to this method, a question arises as to the scale of the encoding and decoding circuits. However, if a cyclic code is used as an ECC and serial encoding and decoding are conducted by positively using the nature of the cyclic code, a small circuit may be used. This is particularly effective for a memory which serially reads and writes data. This method, however, has the following problem. Although n cycle operations of the encoding circuit are required for writing data, 2n cycle operations of the decoding circuit (n cycles for syndrome generation and n cycles for error correcting) are required for reading data. The access times are different respectively for reading and writing, so that the user finds difficulty in making use of the memory.

SUMMARY OF THE INVENTION

An object of the present invention is to solve the above-mentioned problem and provide means by which the user finds no difficulty in making use of a semiconductor memory having an error correcting function.

Another object of the present invention is to provide means by which a semiconductor memory having error correcting means can be tested with ease.

To achieve the above objects, a signal indicative of the completion of preparation for reading/writing is outputted from the memory. The user detects the output of this signal and thereafter, reading/writing data is executed.

To facilitate tests, such as a memory cell test for a redundant bit (check bit), an encoding circuit test and a decoding circuit test, these tests are arranged to be made independently of each other.

DESCRIPTION OF THE PREFERRED EMBODIMENTS

Figure 1:
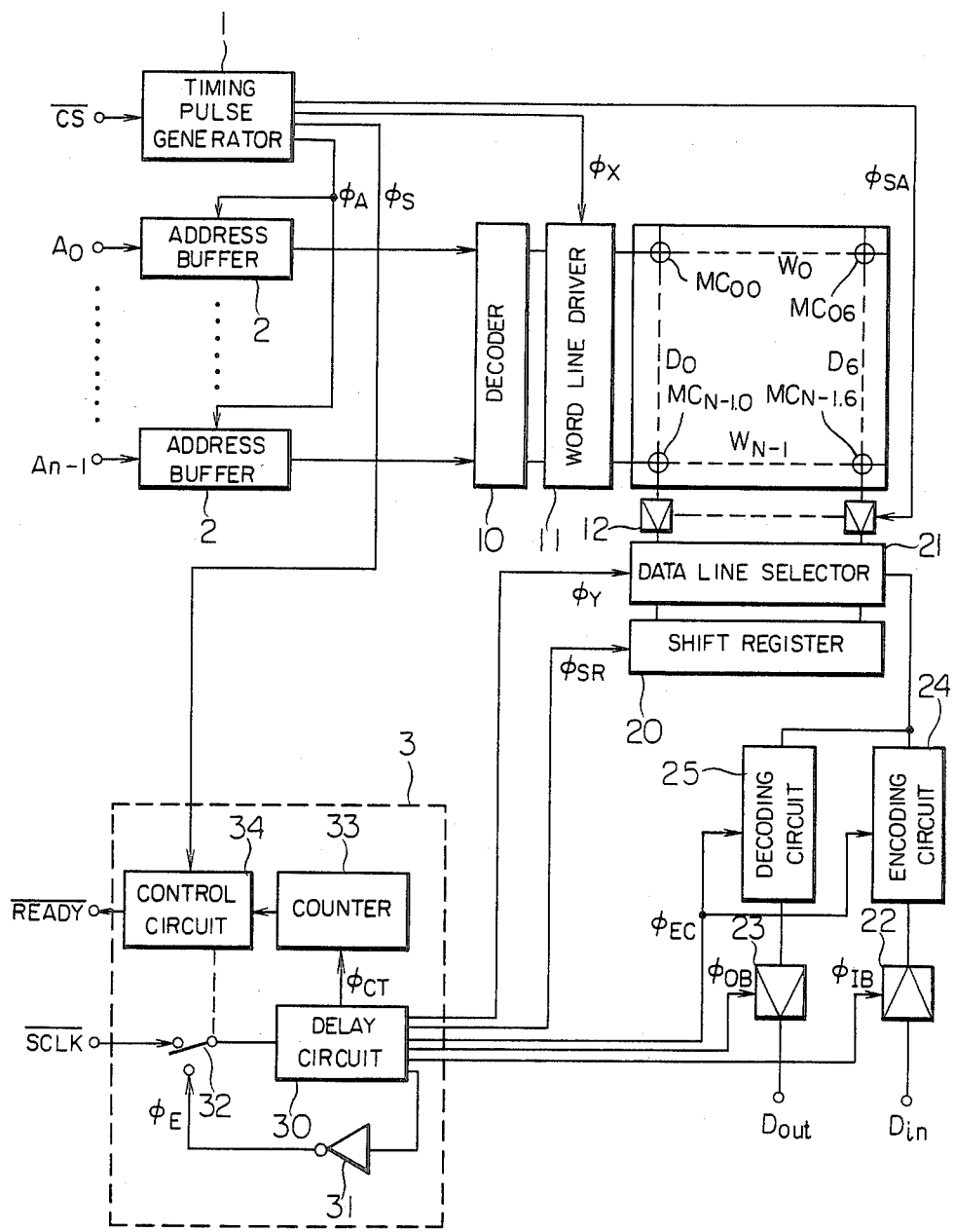
FIGS. 1, 4 and 7 are circuit block diagrams showing first, second and third embodiments of the semiconductor memory according to the present invention.

The first embodiment of this invention will now be described with reference to FIG. 1. Shown in the figure is a dynamic memory which has N word lines $W_0$ to $W_{N-1}$, M (e.g., 7) data lines $D_0$ to $D_6$, and NM (=7N) memory cells $MC_{00}$ to $MC_{N-1, 6}$. The word lines can be randomly selected by a decoder 10, while the data lines are serially selected by a shift register 20 operating in synchronism with clock $\overline{SCLK}$. Therefore, reading/writing data is serially performed one bit after another in synchronism with $\overline{SCLK}$.

This memory has a data correcting function using an error correcting code (ECC). As an ECC, a cyclic Hamming code including 4 information digits and 3 check digits is used here for the purpose of simplification. However, any other code is applicable to the present invention. Data lines, $D_0$ to $D_3$ are for storing information bits and $D_4$ to $D_6$ are for storing redundant bits (or check bits) for the ECC. Addition of the redundant bits for the ECC is conducted by an encoding circuit 24, while error correcting is conducted by a decoding circuit 25. The circuits 24 and 25 respectively encode and decode serially in synchronism with a driving signal $\phi_{EC}$, positively using the nature of a cyclic code.

Figure 2:
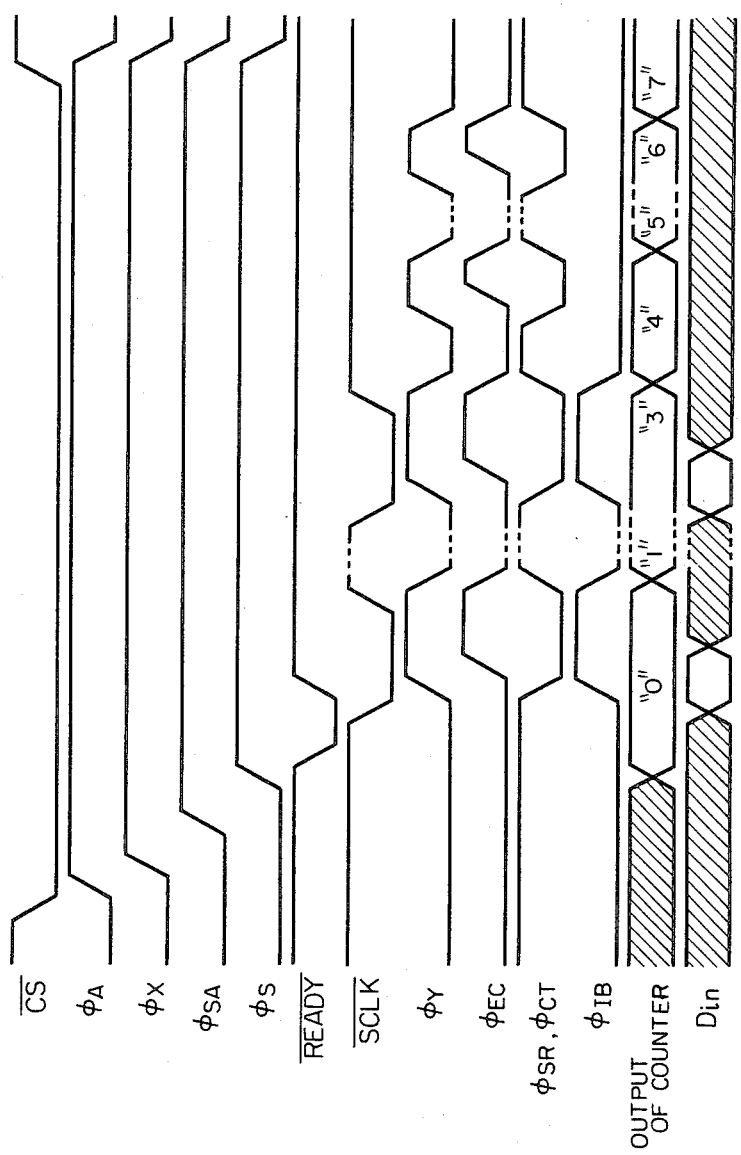
FIGS. 2, 3, 5, 6, 8 and 9 are the timing charts illustrating the operations of the respective embodiments.

The memory write operation will be described with reference to FIG. 2. When a chip select signal $\overline{CS}$ is applied from an external circuit to a timing pulse generator 1, the timing pulse generator 1 outputs an address buffer driving signal $\phi_A$. Upon reception of the address buffer driving signal $\phi_A$, an address buffer receives an address signal from address terminals $A_0$ to $A_{n-1}$ to send it to a decoder 10. Next, the timing pulse generator 1 outputs a word line driving signal $\phi_X$ and thereafter a sense amplifier driving signal $\phi_{SA}$. The signal $\phi_X$ drives one word line (selected by the decoder 10) so that data is read from the memory cells on the selected word line and delivered to respective data lines. The data is amplified in response to the signal $\phi_{SA}$ by sense amplifiers $SA_0$ to $SA_6$.

Succeedingly, the timing pulse generator 1 outputs a signal $\phi_S$ to actuate an input/output control circuit 3. The input/output control circuit 3 is a circuit for controlling data read/write and comprises, as shown in FIG. 1, a delay circuit 30, inverter 31, selector 32, counter 33 and control circuit 34. The delay circuit 30 is a circuit for outputting signals ($\phi_Y$, $\phi_{SR}$, etc.) delayed by an adequate time from the input signal. As an input signal to the delay circuit 30, either one of an external clock $\overline{SCLK}$ or a signal $\angle_E$ obtained by inverting the output of the delay circuit by the inverter 31 is selectively inputted via the selector 32. The counter 33 is a circuit for counting the number of signals generated by the delay circuit 30, and the control circuit 34 is a circuit for changing the connection of the selector 32 upon reception of the output from the counter 33.

Upon reception of a starting signal $\phi_S$, the control circuit 34 immediately outputs a preparation completion signal $\overline{READY}$, which indicates that the memory is ready for data read/write (in this case data write) and requests the user to input clock $\overline{SCLK}$.

When clock $\overline{SCLK}$ becomes low level, the delay circuit 30 first outputs a data line selecting signal $\phi_Y$ and an input buffer driving signal $\phi_{IB}$ (because the selector 32 is previously set at a state selecting the SCLK side). A data line selector 21 selects data line $D_0$ upon reception of $\phi_Y$ (a shift register 20 has been initialized so as to select $D_0$). Upon reception of $\phi_{IB}$, an input buffer 22 receives data from data input terminal $D_{in}$ to send it to an encoding circuit 24. Next, the delay circuit outputs a driving signal $\phi_{EC}$ for encoding and decoding circuits. Upon reception of $\phi_{EC}$ the encoding circuit 24 directly transfers data sent from the input buffer 22 onto the data line (as described previously $D_0$ is selected in this case) and simultaneously therewith, calculates the redundant bits.

When clock $\overline{SCLK}$ returns to its high level, the delay circuit 30 outputs a shift register driving signal $\phi_{SR}$ and a counter driving signal $\phi_{CT}$. The shift register 20 is shifted by $\phi_{SR}$ to enable selecting data line $D_1$. The counter 33 (which has been initialized to have the output "0") is counted up by $\phi_{CT}$ and the output thereof becomes "1".

Next, when $\overline{SCLK}$ becomes low level, data is written onto data line $D_1$. When $\overline{SCLK}$ again returns to its high level, the shift register 20 is again shifted to enable selecting data line $D_2$, and the counter 33 is again counted up to have the output "2".

The similar operations are repeated two times and data are written onto data lines $D_2$, and $D_3$. In this state, the shift register 20 enables selecting data line $D_4$, and the counter 33 has the output "4". Also, the encoding circuit 24 completes the calculation of the redundant bits and the result is stored in its circuit.

When the output of the counter becomes "4", the control circuit 34 switches the selector 32 to the $\phi_E$ side. Consequently, the delay circuit 30, inverter 31 and selector 32 constitute a so-called ring oscillator to initiate oscillation. While the oscillation continues, the delay circuit 30 continues outputting signals (except $\phi_{IB}$) as similar to the case where $\overline{SCLK}$ is inputted. Therefore, data lines are sequentially selected in the order of $D_4$, $D_5$, and $D_6$. Also the encoding circuit 24 outputs a redundant bit stored in the circuit one at a time every time $\phi_{EC}$ is inputted. Thus, the redundant bits are written in $D_4$, $D_5$, and $D_6$ in this order.

When the output of the counter 33 becomes "7", the control circuit switches the selector 32 to the $\overline{SCLK}$ side to stop the oscillation.

Figure 3:
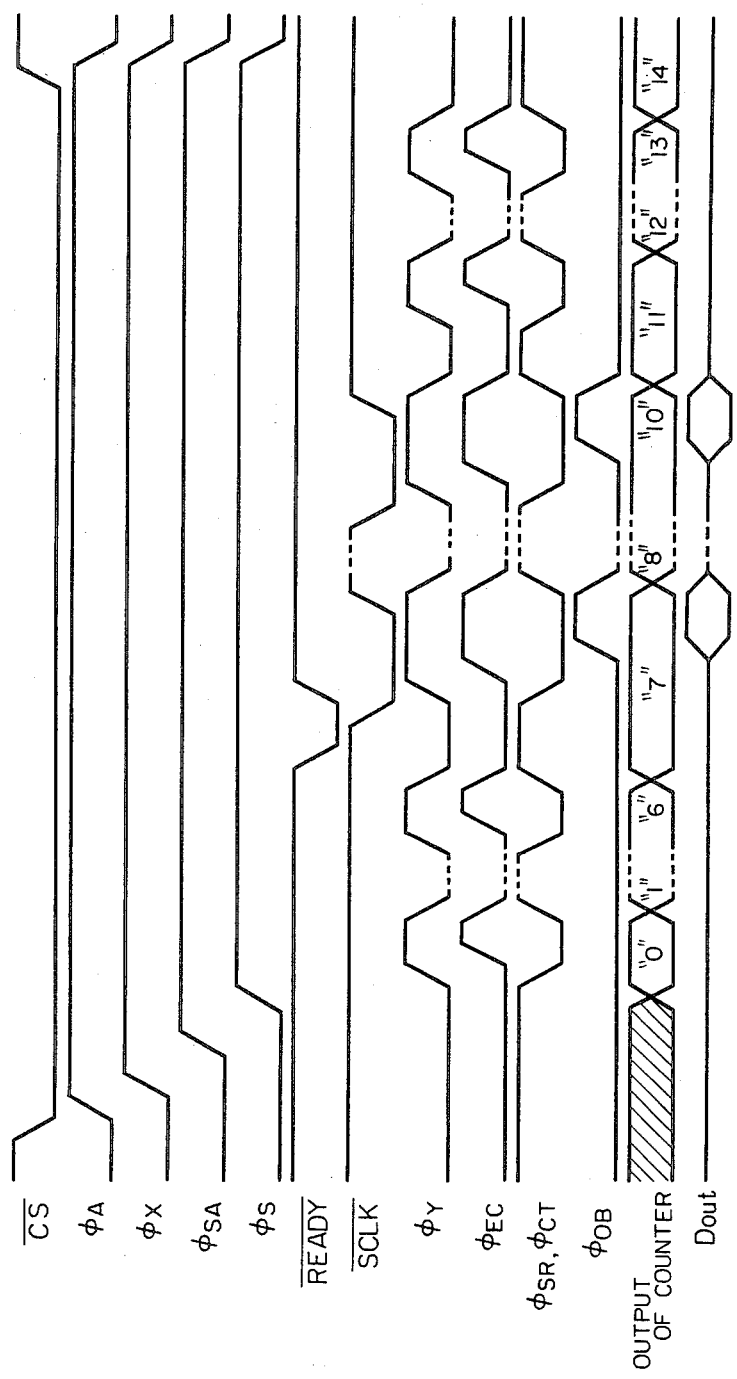

Next, the data read operation will be described with reference to FIGS. 3. The operations starting from when chip select signal CS is inputted from an external circuit and the procedure up to when starting signal $\phi_S$ is outputted, are the same as the case of data write operation, so the description therefor is omitted.

The control circuit 34 switches the selector 32 to the $\phi_E$ side upon reception of starting signal $\phi_S$ (at this time, preparation completion signal $\overline{READY}$ is not outputted). Then, the ring oscillator constructed of the delay circuit 30, inverter 31 and selector 32 starts its oscillation. While the oscillation continues, the delay circuit 30 continues outputting data line selecting signal $\phi_Y$, shift register driving signal $\phi_{SR}$, counter driving signal $\phi_{CT}$ and driving signal $\phi_{EC}$ for encoding and decoding circuits. Similar to the above-described data write operation, the data lines are selected in the order of $D_0$, $D_1$, ... $D_6$, while the outputs of the counter 33 change in the order of "1", "2", ..., "7". Data read out of each data line is sequentially inputted to the decoding circuit 25, which performs calculation of the syndrome in synchronism with driving signal $\phi_{EC}$.

When the output of the counter 33 becomes "7", the control circuit 34 outputs preparation completion signal $\overline{READY}$ and switches the selector to the $\overline{SCLK}$ side to stop the oscillation. The memory waits application of clock $\overline{SCLK}$ from an external circuit.

When $\overline{SCLK}$ is applied from the external circuit, the delay circuit 30 synchronously therewith outputs $\phi_Y$, $\phi_{SR}$, $\phi_{CT}$ and $\phi_{EC}$ as well as output buffer driving signal $\phi_{OB}$. Data lines are again selected in the order of $D_0$, $D_1$, $D_2$ and $D_3$. The decoding circuit 25 outputs in synchronism with $\phi_{EC}$ the corrected result of information bits one bit at a time to an output buffer 23 which in turn delivers them to output terminal $D_{out}$ in synchronism with $\phi_{OB}$. The corrected information bits are also transferred to the data lines. Consequently, the corrected result of original information bits are rewritten in data lines $D_0$, $D_1$, $D_2$ and $D_3$.

When the output of the counter 33 becomes "11" after clock $\overline{SCLK}$ was inputted four times, the control circuit 34 again switches the selector 32 to the $\phi_E$ side. As the oscillation resumes, the delay circuit 30 continues outputting $\phi_Y$, $\phi_{SR}$, $\phi_{CT}$ and $\phi_{EC}$ ($\phi_{OB}$ is not outputted). Data lines are selected in the order of $D_4$, $D_5$ and $D_6$. The decoding circuit 25 outputs the corrected result of redundant bits one bit at a time in synchronism with $\phi_{EC}$. Consequently, the corrected result of original redundant bits are rewritten in data lines $D_4$, $D_5$ and $D_6$.

When the output of the counter 33 becomes "14", the control circuit 34 again switches the selector 32 to the $\overline{SCLK}$ side to stop the oscillation.

As apparent from the foregoing description, in the memory of this embodiment, time $t_D$ from when chip select signal $\overline{CS}$ is applied to when preparation completion signal $\overline{READY}$ is outputted, differs between data reading and data writing. That is, assuming the period of self-oscillation of the delay circuit 30 is $t_c$, time $t_d$ for data reading is longer by $7t_c$ than that for data writing. However, the user can readily starts data reading or data writing by detecting the output of $\overline{READY}$ and applying $\overline{SCLK}$ four times.

Figure 4:
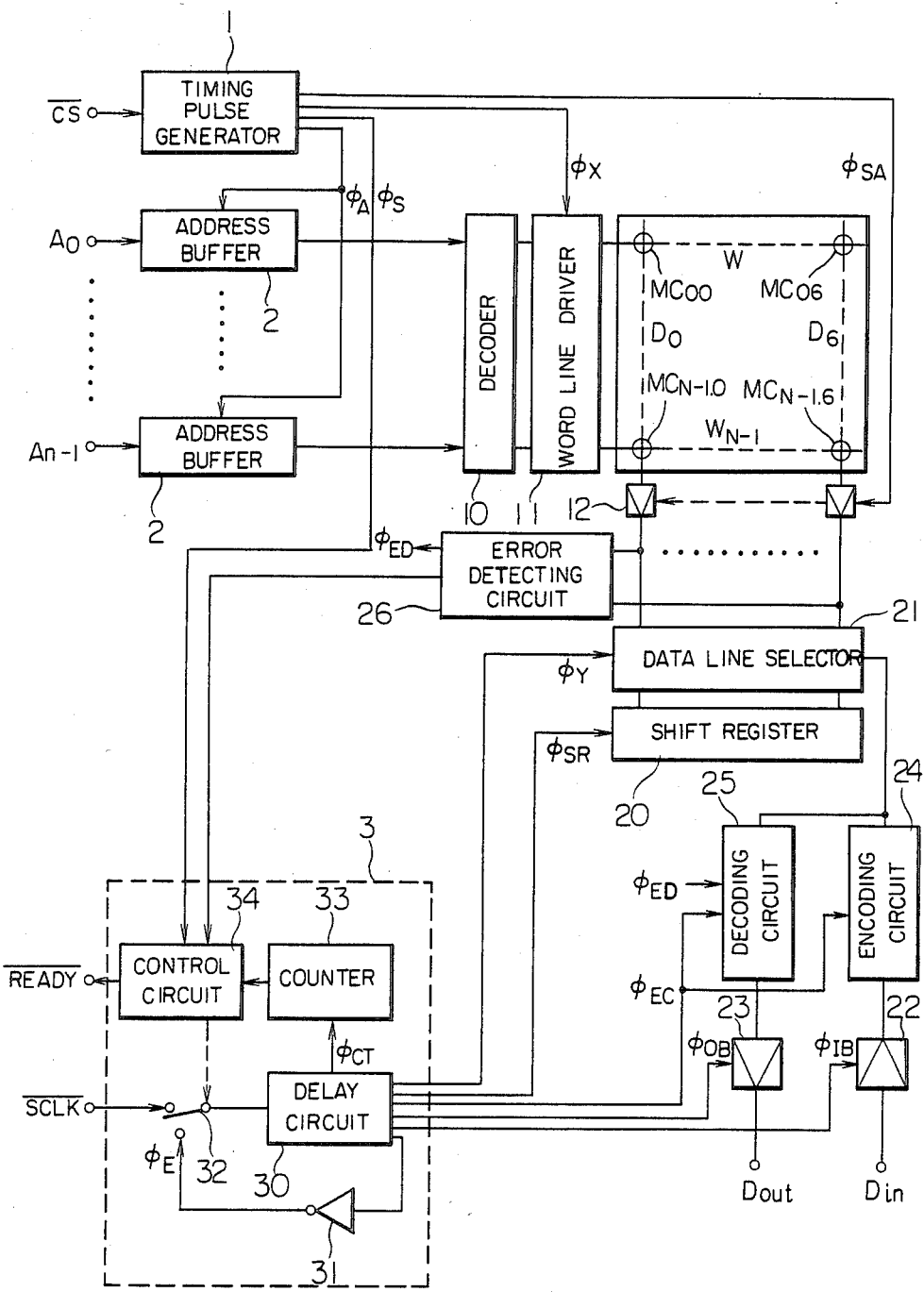

The second embodiment of the present invention is shown in FIG. 4. The difference from the embodiment of FIG. 1 resides in that an error detecting circuit 26 is provided. This circuit has no error correcting capability, but it can perform error detecting in a parallel fashion (using a combination logic circuit). Since the data write operation of the memory is the same as that of the first embodiment (FIG. 2), the description therefor is omitted. The data read operation will be described with reference to FIGS. 5 and 6.

Figure 5:
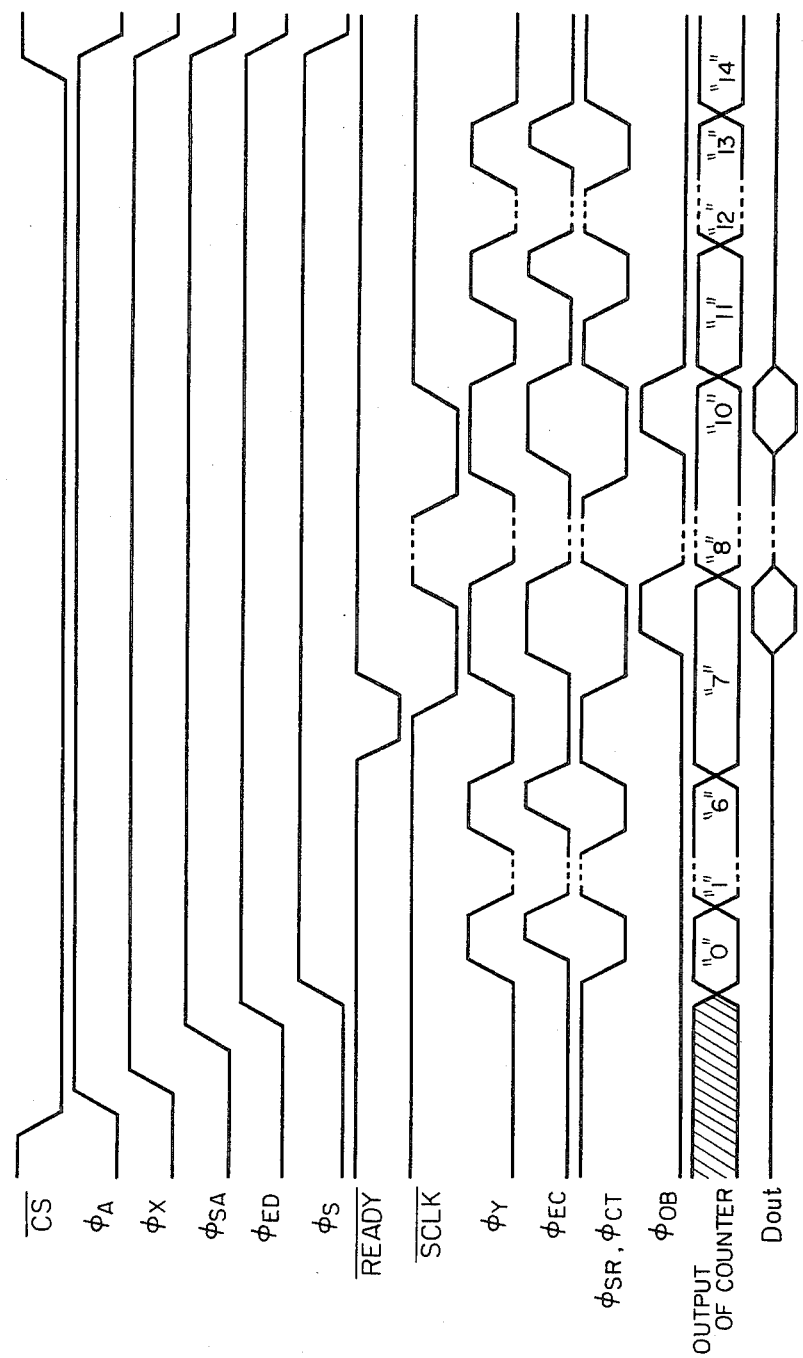
Figure 6:
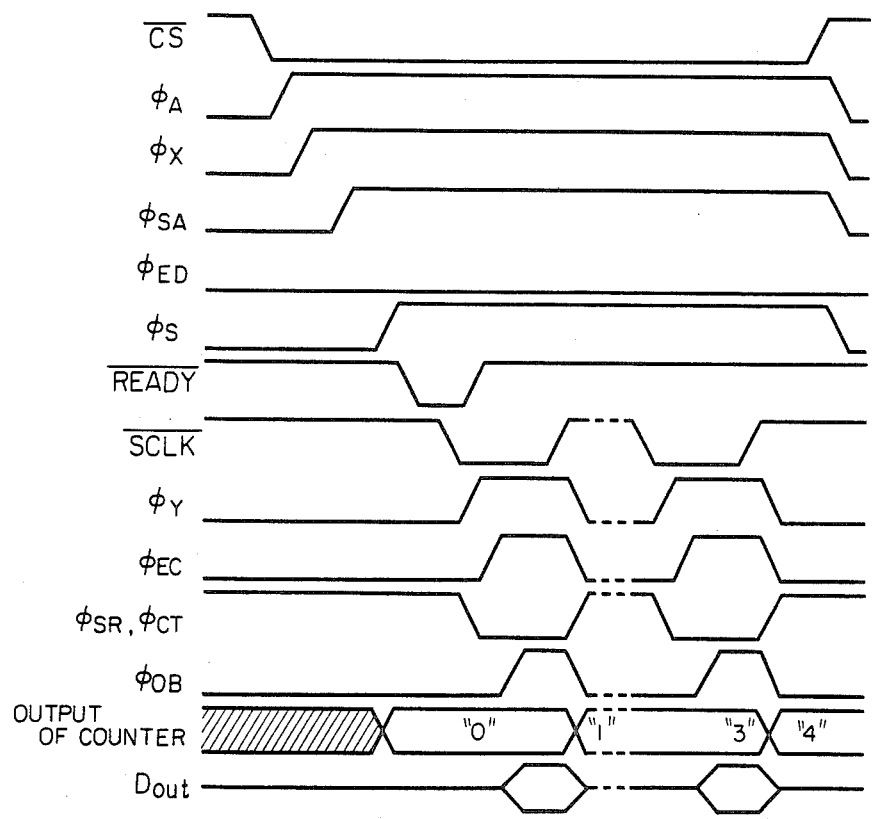

The operations starting from when chip select signal $\overline{CS}$ is applied from an external circuit to when the the sense amplifiers operate is the same as those of the first embodiment. After completion of the amplification operation by the sense amplifiers, the error detecting circuit 26 judges if there is an error in the readout data. If an error is present, signal $\phi_{ED}$ goes to a high level, as shown in FIG. 5, while if no error is present, signal $\phi_{ED}$ goes to a low level, as shown in FIG. 6.

Next, the input/output control circuit 3 is actuated by starting signal $\phi_S$, the operation of which differs depending on the presence or absence of an error. The operation in the presence of an error is the same as that of the first embodiment. In particular, syndrome calculation is first conducted with 7 cycle self-oscillations. Next, in synchronism with 4 cycle external clocks $\overline{SCLK}$, correction of information bits and data output are performed. Lastly, correction of redundant bits are performed with 3 cycle self-oscillations.

In the case where an error is not present (FIG. 6), the control circuit 34 immediately outputs preparation completion signal $\overline{READY}$ upon reception of starting signal $\phi_S$. When clock SCLK is applied from an external circuit (the selector 32 remains at a state selecting the $\overline{SCLK}$ side), the delay circuit 30 outputs data line selecting signal $\phi_Y$ shift register driving signal $\phi_{SR}$, counter driving signal $\phi_{CT}$, driving signal $\phi_{EC}$ for encoding and decoding circuits and output buffer driving signal $\phi_{OB}$. Data lines are selected in the order of $D_0$, $D_1$, $D_2$ and $D_3$, while the outputs of the counter changes in the order of "1", "2", "3" and "4". Data read out of each data line is sequentially inputted to the decoding circuit 25 which at this time merely transfers the data to the output buffer 23 in response to the low level of $\phi_{ED}$ without correcting the data. The output buffer 23 delivers the data to output terminal $D_{out}$ in synchronism with $\phi_{OB}$.

In this embodiment, the time from when, the chip select signal $\overline{CS}$ is applied to when the preparation completion signal $\overline{READY}$ is outputted is not constant. In particular, the time is the same if there is no error in data writing and data reading. However, if there is an error in reading data, the time is longer by 7 $t_c$ ($t_c$ is the period of self-oscillation) than that in data writing. The user, however, can readily proceed with either data writing or data reading by merely detecting the output of $\overline{READY}$ and applying $\overline{SCLK}$ four times.

Figure 7:
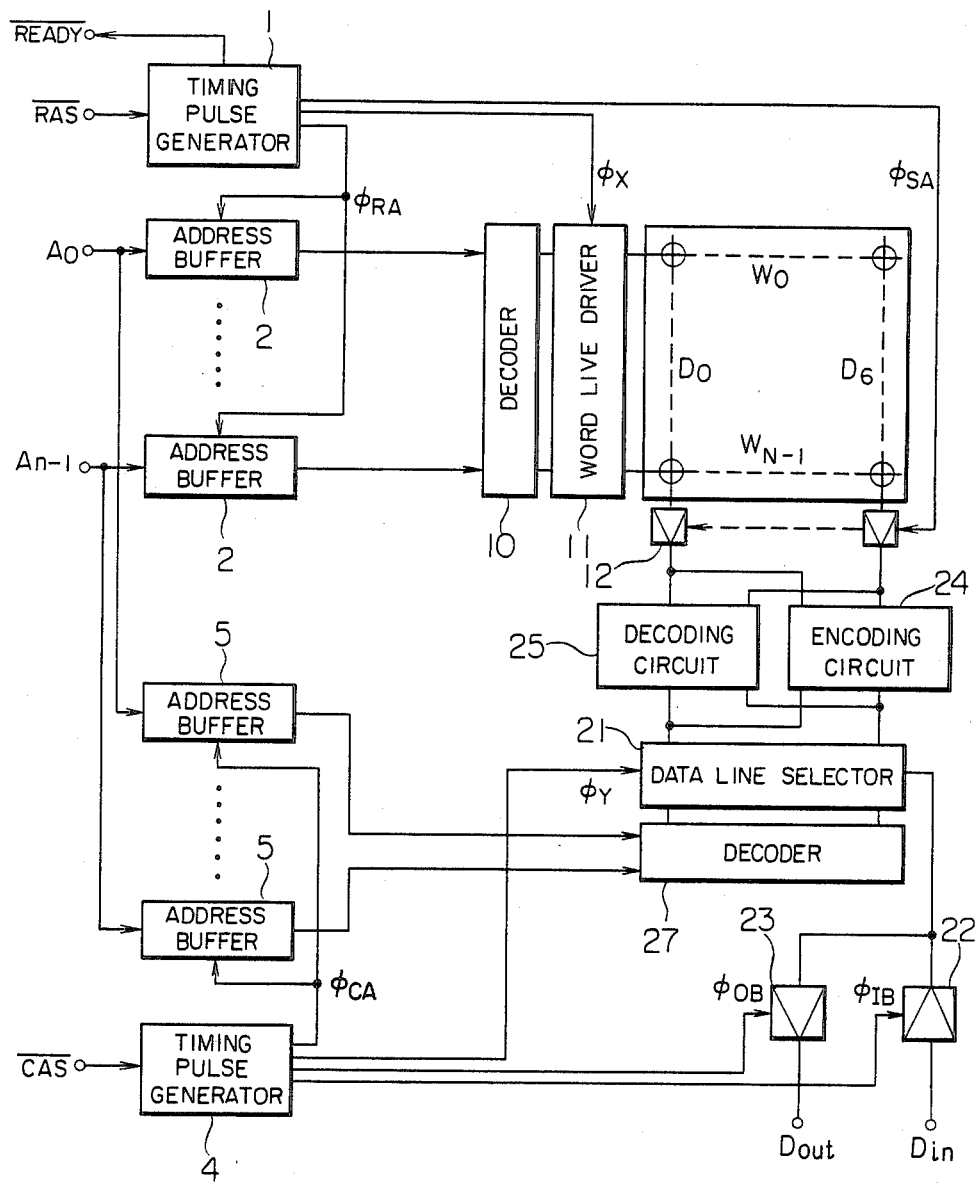
Figure 8:
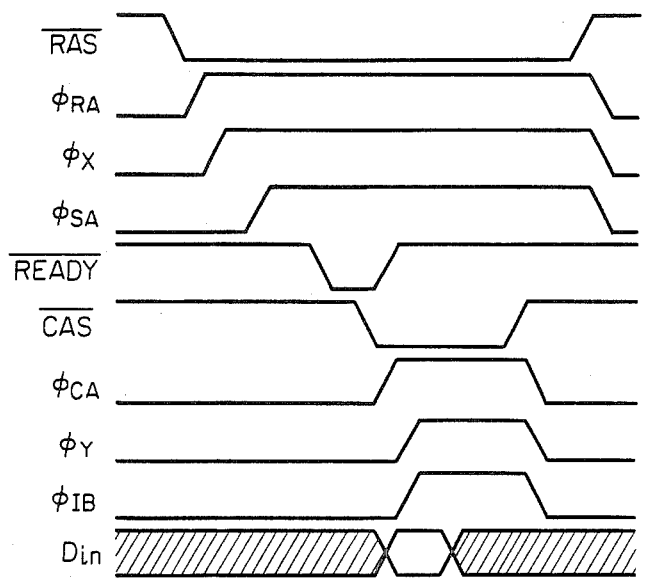
Figure 9:
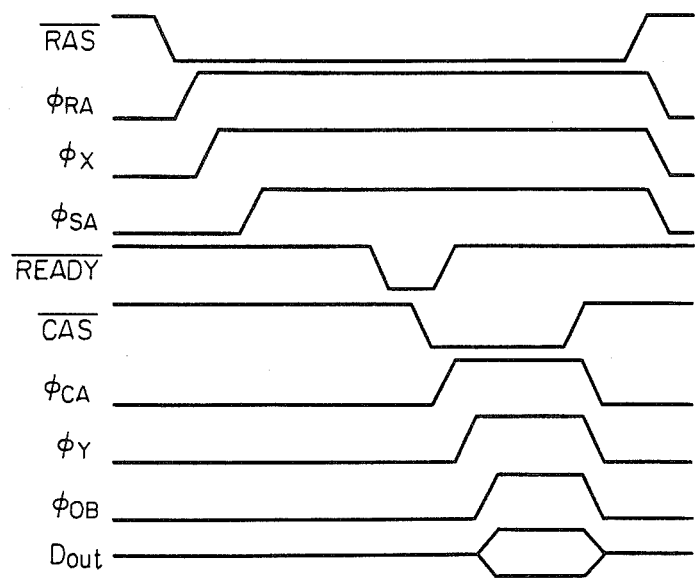

The present invention is applicable not only to a memory performing data reading and writing in serial but also to a random access memory (RAM). A third embodiment, where the present invention is applied to a dynamic RAM (DRAM), is shown in FIG. 7, and the timing charts respectively illustrating the reading and writing operations are shown in FIGS. 8 and 9.

The operations from when the row address strobe $\overline{RAS}$ is applied to when the sense amplifiers start operating is not explained since the operations are the same as those in a usual DRAM. The timing pulse generator 1 outputs preparation completion signal $\overline{READY}$, immediately after the operation of sense amplifiers in the case of data writing (FIG. 8), or after the decoding circuit 25 corrects an error in the case of data reading (FIG. 9).

When the column address strobe $\overline{CAS}$ is applied from an external circuit, the timing pulse generator 4 first outputs driving signal $\phi_{CA}$ for a column address buffer. Upon reception of $\phi_{CA}$ the column address buffer 5 receives a column address signal from address terminals $A_0$ to $A_{n-1}$ to send it to a column decoder 27. Next, the timing pulse generator 4 outputs either data line selecting signal $\phi_Y$ and input buffer driving signal $\phi_{IB}$ (in the case of data writing) or output buffer driving signal $\phi_{OB}$ (in the case of data reading). One data line (selected by the column decoder 27) is driven by $\phi_Y$. Since an error has previously been corrected by the decoding circuit 25 in the case of data reading, error-corrected data is read out to output terminal $D_{out}$ by $\phi_{OB}$. In the case of data writing, data is fetched from input terminal $D_{in}$ by $\phi_{IB}$ to replace it with the data read from memory cells. Thereafter, redundant bits are added by the encoding circuit 24 to write them in the memory cells.

Also in this embodiment, the time from when $\overline{RAS}$ is applied to when $\overline{READY}$ is outputted differs between data reading and data writing. However, the user can readily perform either data reading or data writing merely by detecting $\overline{READY}$ and thereafter applying $\overline{CAS}$.

According to the embodiments shown in FIGS. 1 to 9, it is possible for the user to find no difficulty in making use of a memory which has different access times due to its error correcting function.

Checking or testing the memory after it is manufactured in accordance with this invention, includes various kinds of tests including a test for an error correcting function. In testing the semiconductor memory, it is specifically pointed out that it has a built-in error correcting function. However, if for example a single-error correcting code is used as an ECC and the memory accidentally has a defect (hard error) in one memory cell, then in this case the defect cannot be found because the readout data is corrected by the ECC, thus resulting in an apparent error-free memory.

Futhermove, if an error occurs at another memory cell belonging to the same error correcting block unit including the defected memory cell, then two bit errors in total become present to accordingly make it impossible to correct the error.

Therefore, to reliably perform various tests of a semiconductor memory having an error correcting function, it is necessary to test the memory cells per se and the error correcting function including an encoding circuit and decoding circuit, independently of each other. However, such a testing method has not been proposed as yet.

The present invention seeks to solve this problem and provide a semiconductor memory having a built-in error correcting function using an ECC, which can test the memory cells per se for storing redundant bits of the ECC, i.e., check bits, encoding circuit, decoding circuits and the like, independently of each other.

To this end, according to the present invention, the semiconductor memory having encoding means for adding check bits to data in accordance with an error correcting code and decoding means for error-correcting the data having the check bits, comprises read/write means (terminal aa and others) for reading/writing the check bits in a similar way to that of said data, and means (terminal ECCE and others) for inhibiting the operation of an error correction by the decoding circuit.

The fourth embodiment will now be described with reference to the accompanying drawings.

Figure 10:
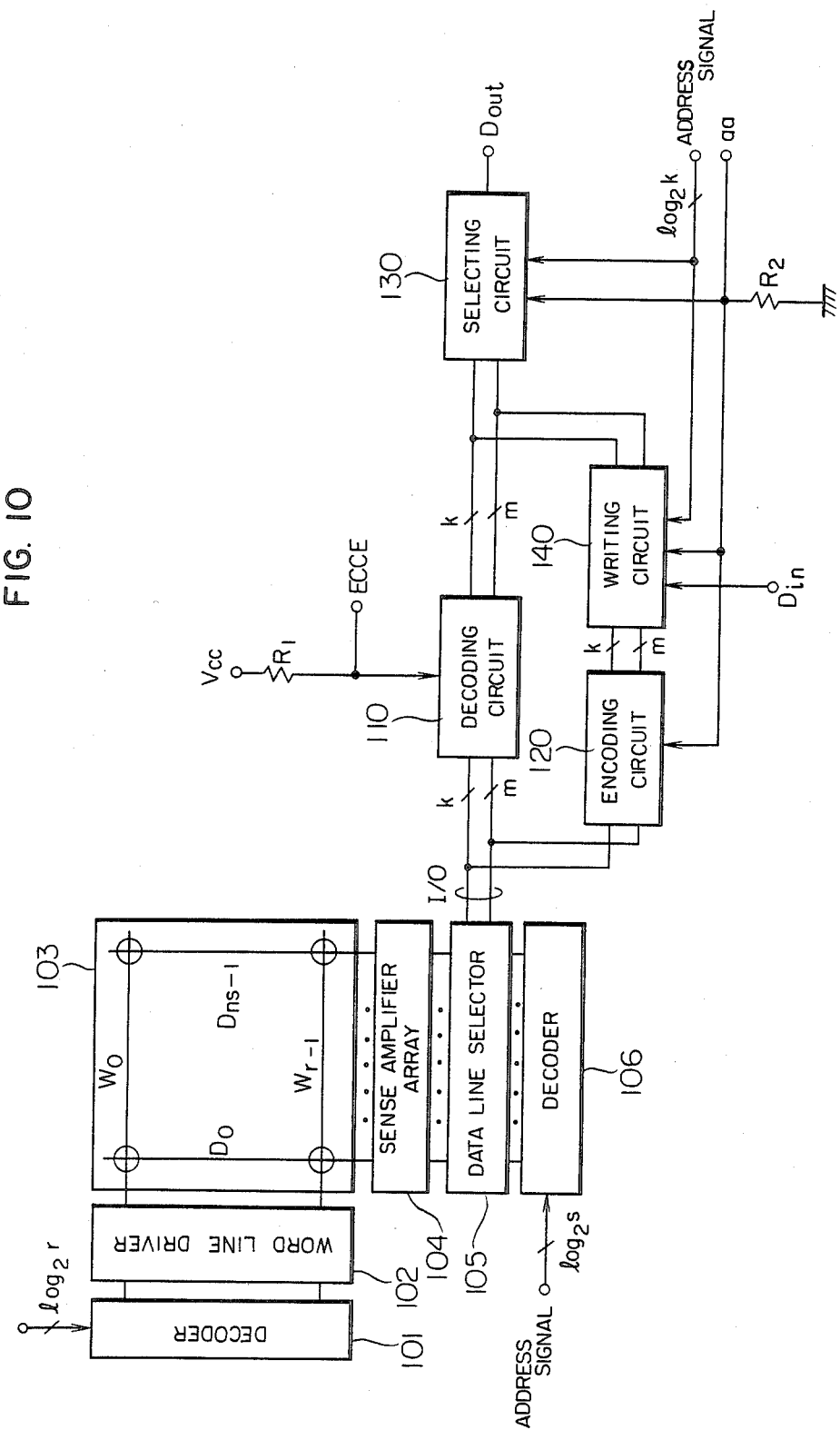
FIG. 10 is a circuit block diagram showing a fourth embodiment of the semiconductor memory according to the present invention.

FIG. 10 is a circuit block diagram showing the fourth embodiment of the semiconductor memory according to the present invention. In the figure, a decoder 101 decodes $\log_2 r$ address signals and identifies one line of word lines $W_0$ to $W_{r-1}$ of a memory array 103 via a word line driver 102. A sense amplifier array 104 reads and amplifies data of all of the memory cells on the selected (single) word line via data lines $D_0$ to $D_{ns-1}$. A decoder 106 decodes $\log_2 s$ address signals to identify n data lines among data lines $D_0$ to $D_{ns-1}$ and sending (n) data from the identified sense amplifier array 104 to (n) common I/O lines via a data line selector 105. The error correcting function using an ECC is constructed of a decoding circuit 110, encoding circuit 120, selecting circuit 130 and writing circuit 140.

The semiconductor memory of this embodiment is a RAM and has an error correcting function using an ECC of a code length n (n=k+m), where k is the number of information digits and m is the number of check digits. The semiconductor memory also has a terminal ECCE for inputting an ECC enable signal and terminal aa for identifying check bits. In an ordinary operating state, terminal ECCE is set at a high level (logic "1") through a resistor $R_1$ and terminal aa is set at a low level (logic "0") through a resistor $R_2$, to activate the error correcting function and store various data. Although the detailed description will be given later, the error correcting function is inhibited by setting terminal ECCE at a low level (logic "0"), and the check bits are written/read for the purpose of testing by setting the other terminal aa at a high level (logic "1").

Next, the construction and operation of the circuits 110 to 140 composing the error correcting function using an ECC will be described with reference to FIGS. 11 to 14.

Figure 11:
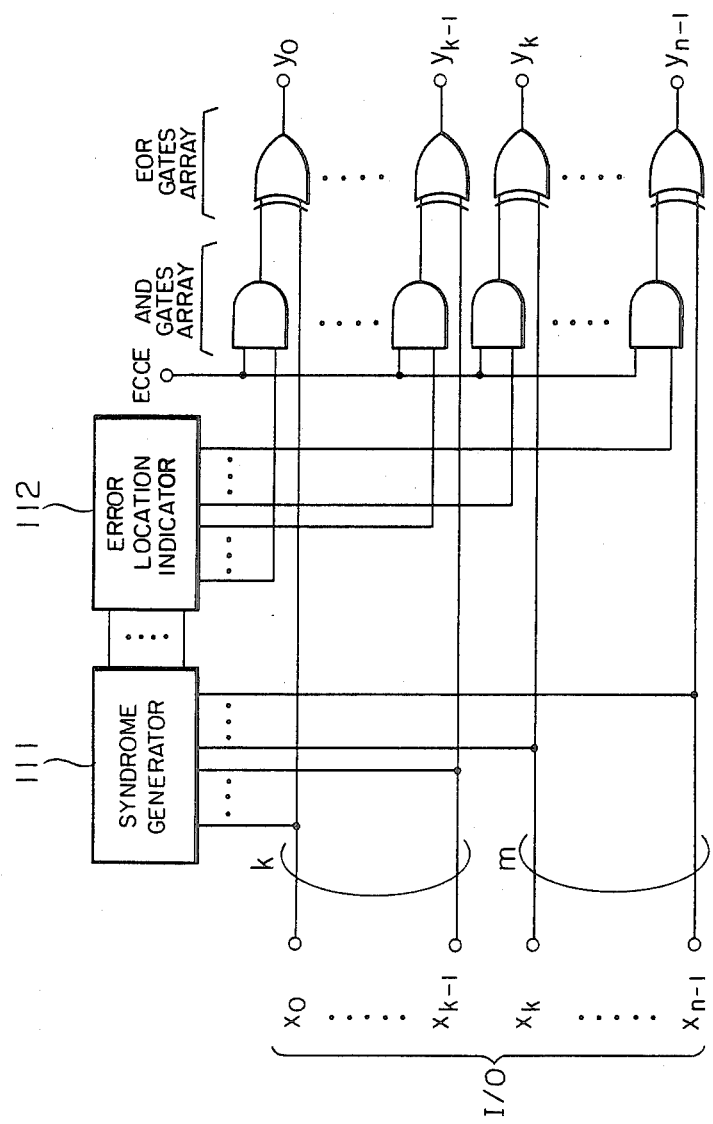
FIGS. 11 to 14 are circuit diagrams illustrating the error correcting function using an ECC.

To perform an error correcting operation using an ECC, the decoding circuit 110 is constructed of, as shown in FIG. 11, a syndrome generator 111, error location indicator 112, error correcting Exclusive-OR gate array and AND gate array. The syndrome generator 111 generates a syndrome of data $X_0$ to $X_{n-1}$ from the common I/O lines to send it to the error location indicator 112. The error location indicator 112 analyzes the syndrome to assume the error location of data $X_0$ to $X_{n-1}$, and changes only the error-assumed output line among n output lines to a logic "1" (the other lines are all made logic "0").

In this case, if an error correcting operation is to be conducted, the n outputs are directly sent to the EOR gate array via the AND gate array, so that only the error-assumed bit among data $X_0$ to $X_{n-1}$ is inverted to obtain an output $Y_0$ to $Y_{n-1}$. On the contrary, if an error correcting operation is not to be conducted, all of the outputs from the AND gate array become logic "0", so that data $X_0$ to $X_{n-1}$ is directly sent as an output $Y_0$ to $Y_{n-1}$.

Figure 12:
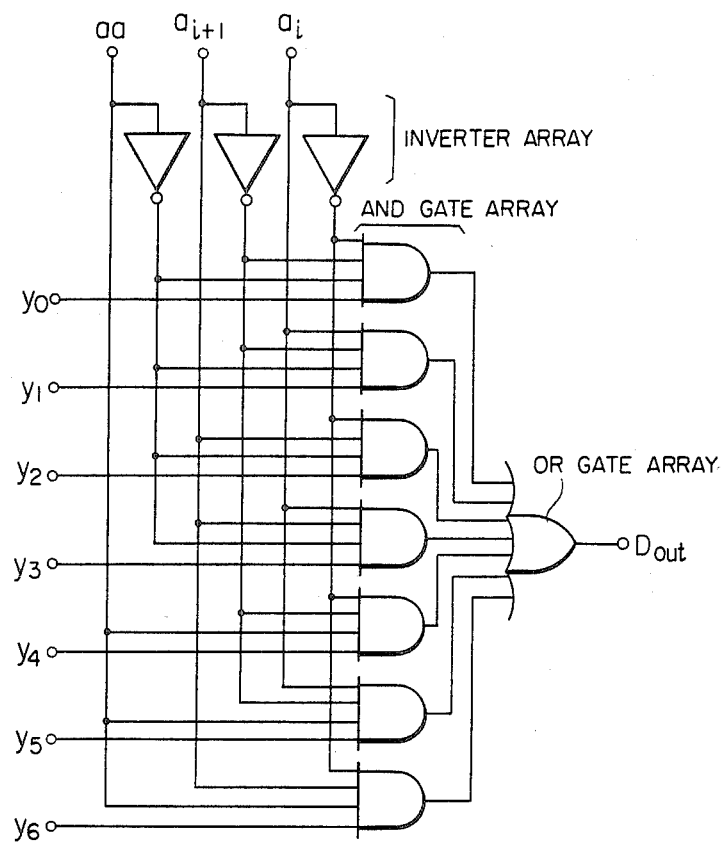

The selecting circuit 130 is constructed of, as shown in FIG. 12, an inverter array, AND gate array and OR gate array so that data $Y_0$ to $Y_6$ (where n=7, K=4, M=3) is sent to output terminal $D_{out}$ to read the data in the memory array 103 in accordance with the contents of terminal aa and $\log_2 k$ address signals.

More in detail, based on the contents of three address signals $a_i$, $a_{i+1}$ and aa, one of input data $Y_0$ to $y_6$ is selected to send it to $D_{out}$ via the AND and OR gate arrays. In this case, if aa is a logic "0", the above selection is made from $y_0$ to $y_3$, i.e., from information bits. On the contrary, if aa is a logic "1", then it is made from $y_4$ to $y_6$, i.e., from check bits.

In other words, to the addresses $a_i$, $a_{i+1}$ which are used originally to read information bits $y_0$ to $y_3$, address signal aa is added, thus enabling reading both information bits and check bits.

Figure 13:
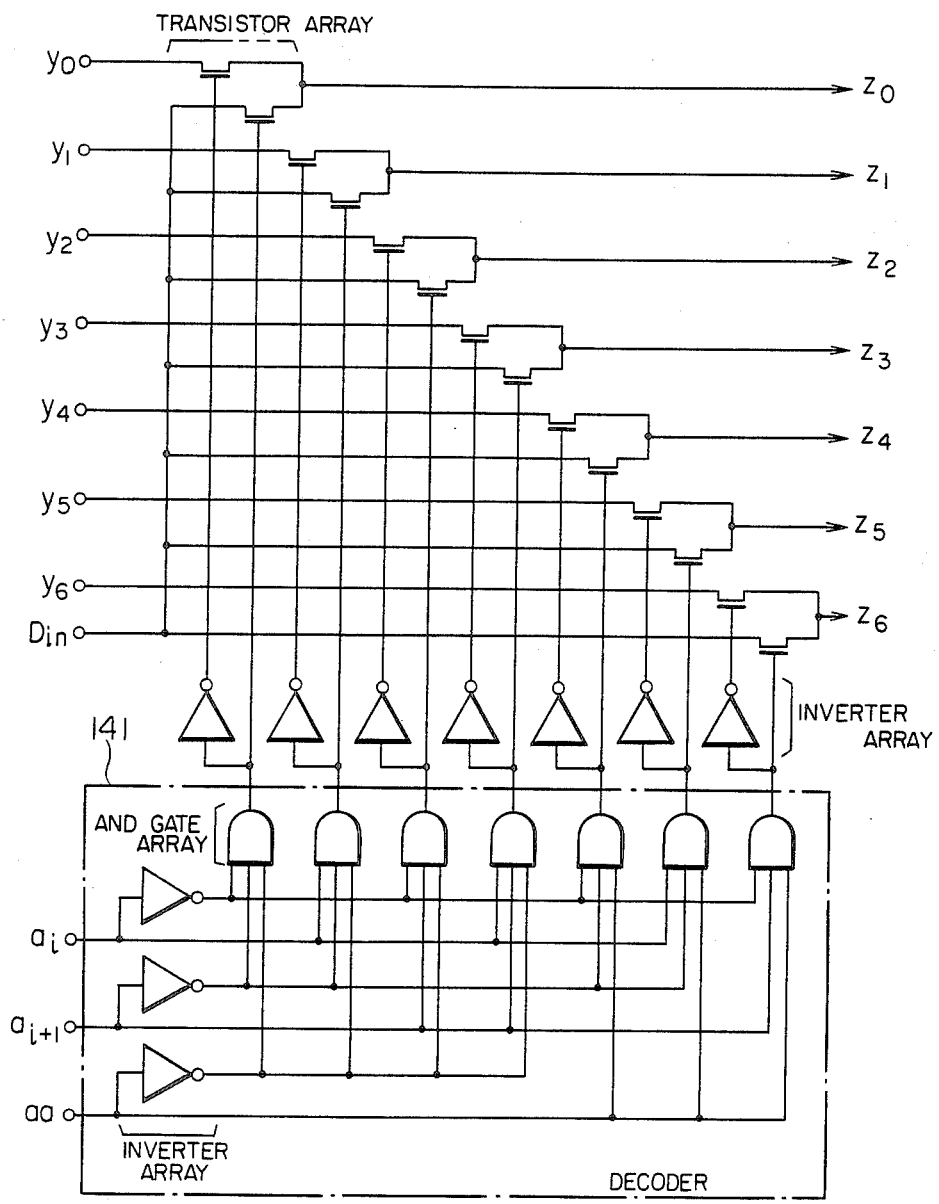

The writing circuit 140 is constructed of, as shown in FIG. 13, a decoder 141 made of an inverter array and an AND gate array, inverter array and transistor array, so that based on the contents of aa and $\log_2 k$ address signals, one bit among data $y_0$ to $y_6$ (where n=7, k=4 and m=3) is replaced with data from input terminal $D_{in}$ to send it to the encoding circuit 120 and rewrite it in the memory array 103.

More in detail, based on the contents of three address signals $a_i$, $a_{i+1}$ and aa, one of data $y_0$ to $y_6$ from the decoding circuit 110 is replaced with data from $D_{in}$ to send it to the encoding circuit 120. In this case, if aa is a logic "0", the above replacement is made from $y_0$ to $y_3$ (information bits). On the contrary, if aa is a logic "1", then it is made from $y_4$ to $y_6$ (check bits).

In other words, similar to the selecting circuit 130, to the addresses $a_i$, $a_{i+1}$ which are used originally for replacing information bits $y_0$ to $y_3$, address signal aa is added, thus enabling writing desired data for both information bits and check bits. In this embodiment, $k \geq m$ is assumed so that only a single address signal aa can suffice. However, in case k<m, the number of address signals are increased to meet such a case.

Figure 14:
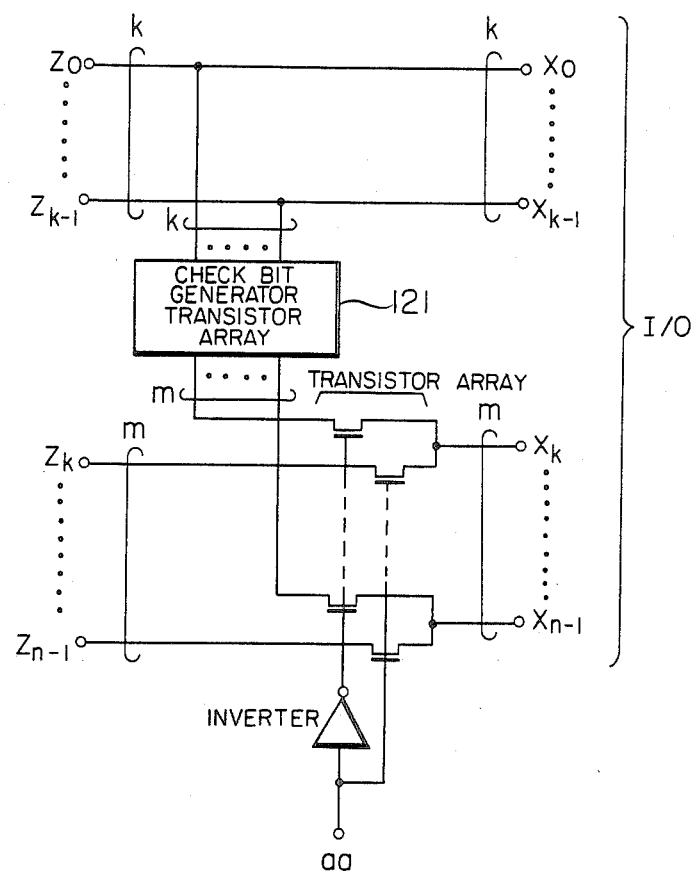

The encoding circuit 120 is constructed of, as shown in FIG. 14, a check bit generator 121, transistor array and inverter, so that when data $Z_0$ to $Z_{n-1}$ from the writing circuit 140 is outputted to common I/O lines $x_0$ to $x_{n-1}$ to read the data in the memory array 103, information bits ($Z_0$ to $Z_{k-1}$) remain unchanged while check bits ($Z_k$ to $Z_{n-1}$) either remain unchanged or are replaced with newly generated check bits.

More in detail, the check bit generator 121 generates m check bits for an ECC based on the contents of $Z_0$ to $Z_{k-1}$ (information bits). In this case, if aa is a logic "0", the check bits generated by the check bit generator 121 are delivered onto $x_k$ to $x_{n-1}$. On the contrary, if aa is a logic "0", then $Z_k$ to $Z_{n-1}$ are directly delivered onto $x_k$ to $x_{n-1}$. Thus, together with $Z_0$ to $Z_{k-1}$, the generated check bits or $Z_k$ to $Z_{n-1}$ per se are written in the memory array 103 via the data line selector 105.

Checking or testing the semiconductor memory after manufacture, described in the foregoing, can be summarized as follows.

(1) Test for Memory Cell

A test for a memory array itself including the memory cells for check bits is carried out in such a way that with ECCE remaining at a logic "0" (inhibition of the error correcting function), check data "1s" and "0s" are written in the memory array 103 and thereafter they are read to be checked. In this case, aa is also scanned as in the case of the other original addresses.

(2) Test for Encoding

A test for checking if check bits are correctly added by the encoding circuit 120 is carried out in such a way that the logic of ECCE is set at "1" (operating under the error correcting function) and aa is set at a logic "0" to write information bits, and thereafter the information bits are read by setting the logic of ECCE at "0" (inhibition of the error correcting function) while check bits are read by setting the logic of aa at "1" (identification of the check bits) to check the contents of data.

(3) Test for Decoding

A test for checking if information bits are correctly error-corrected by the decoding circuit 110 is carried out in such a way that the information bits are written by setting the logic of ECCE at "0" and the logic of aa at "0" and succeedingly the check bits are written by changing the logic of aa to "1", and thereafter the information bits are read by setting the logic of ECCE at "1" and the logic of aa at "0" to check the contents of data. Succeedingly, a test for checking if the check bits are correctly error-corrected is carried out in such a way that only the logic of aa is changed to "1" to read the check bits and check them. In this case, test data to be written is arranged to have the contents including an error correctable by the decoding circuit 110.

In this embodiment, terminals ECCE and aa are provided for inputting the ECC enable signal and the address signal. However, another terminal may be used for inputting both signals by using it in a time-sharing fashion. Alternatively, such signals may be generated in the internal circuit by using a combination of signals not used in a normal operation (e.g., in a static RAM, both output enable signal OE and write enable signal WE are inputted).

Next, the fifth embodiment of the present invention will be described in detail with reference to FIGS. 15 to 21.

Figure 15:
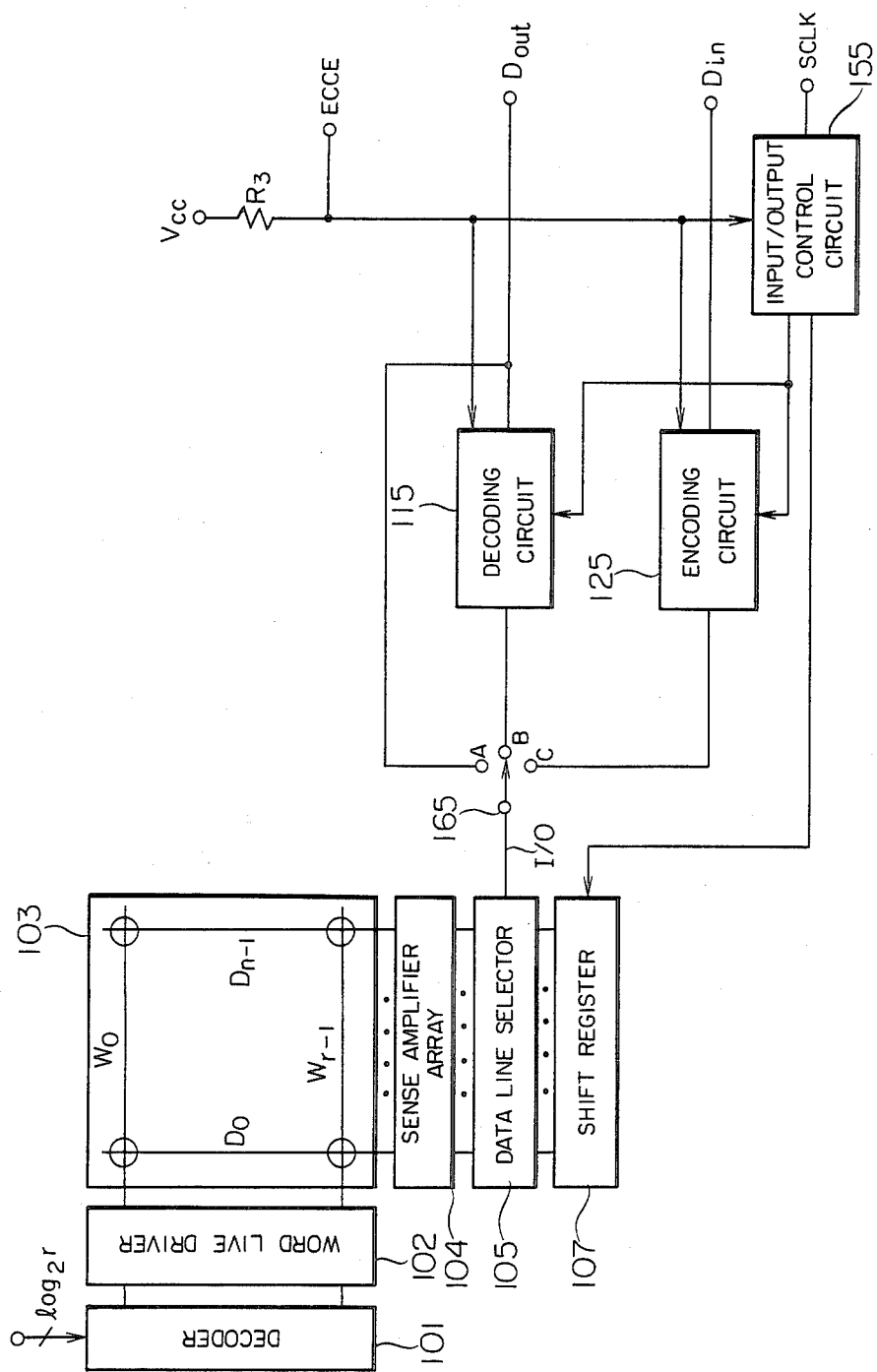
FIG. 15 is a circuit block diagram showing a fifth embodiment of the semiconductor memory according to the present invention.

FIG. 15 is a circuit diagram of the semiconductor memory of the fifth embodiment. The difference from the embodiment of FIG. 10 resides in the following four points (i) to (iv).

(i) Data lines $D_0$ to $D_{n-1}$ are serially selected. That is, although r word lines $W_0$ to $W_{r-1}$ are randomly selected by a decoder 101, similar to the case of FIG. 10, n data lines $D_0$ to $D_{n-1}$ are selected in the order of $D_0, D_1, D_2, \ldots, D_{n-1}$ by means of a shift register 107 shifting in synchronism with clock signal SCLK from an external circuit. Data lines $D_0$ to $D_{n-1}$ are constructed of, similarly to the case described previously, $D_0$ to $D_{k-1}$ for storing k information bits and $D_k$ to $D_{n-1}$ for storing m check bits. Therefore, writing/reading the information bits with respect to a memory array 103 is performed k times by one bit at a time in synchronous timing with signal SCLK.

(ii) A cyclic code is adopted as an ECC. Therefore, as an encoding circuit 125 and decoding circuit 115, those circuits are used which perform encoding and decoding serially by positively using the nature of a cyclic code.

(iii) An input/output control circuit 155 is provided, which is inputted with SCLK signal and ECC enable signal and generates a timing pulse for driving the shift register 107, encoding circuit 125 and decoding circuit 115. Although the detailed description will be given later, the timing pulse is delivered, as occasions arise, even if SCLK signal is not inputted.

(iv) A switch 165 is provided, which switches the common I/O lines from the data line selector 105 to connect either to the output or input side of the decoding circuit 115 or to the output side of the decoding circuit 125.

Figure 16:
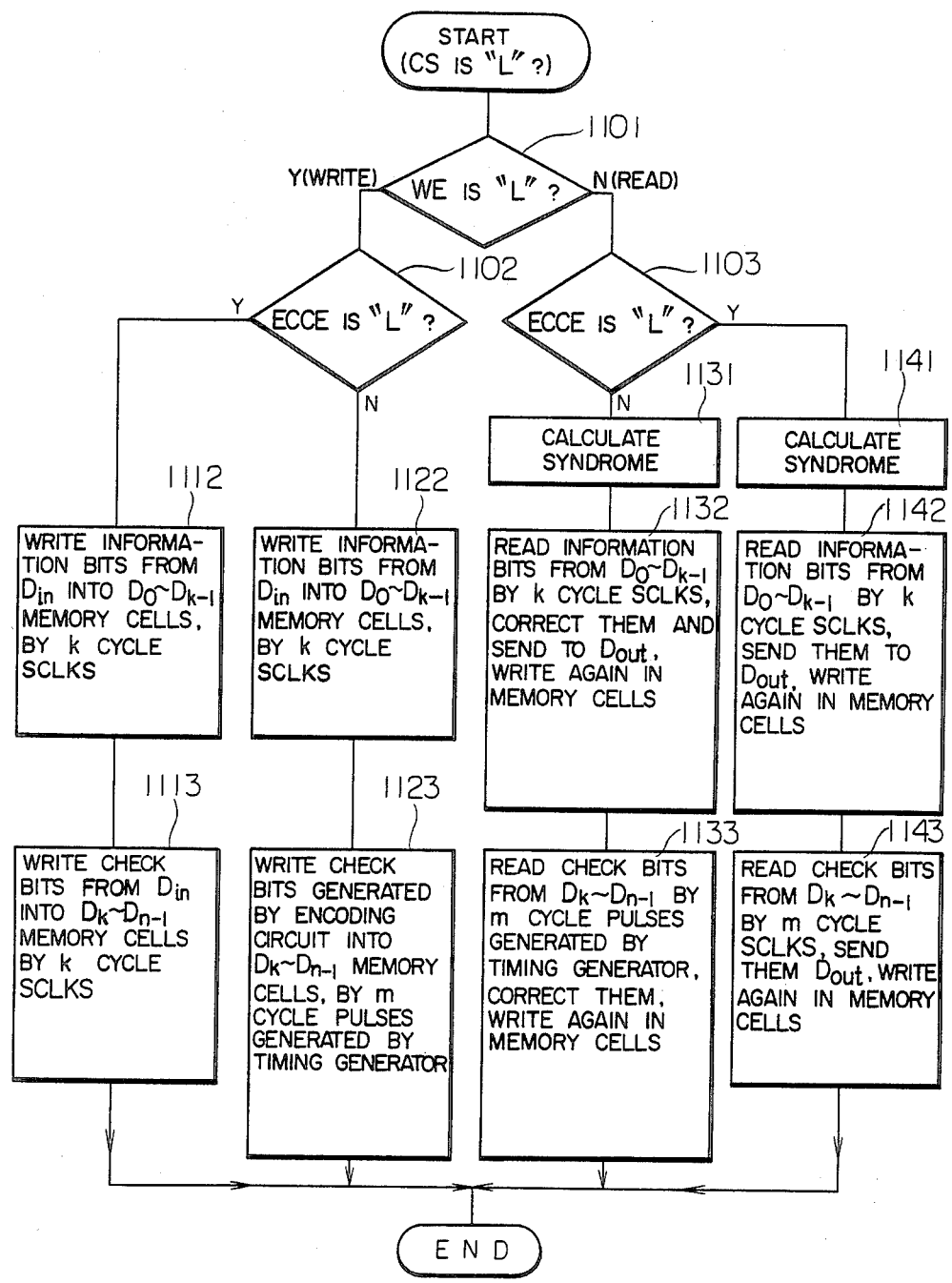
FIG. 16 is a flow chart illustrating the operation of the semiconductor memory of FIG. 15.
Figure 17:
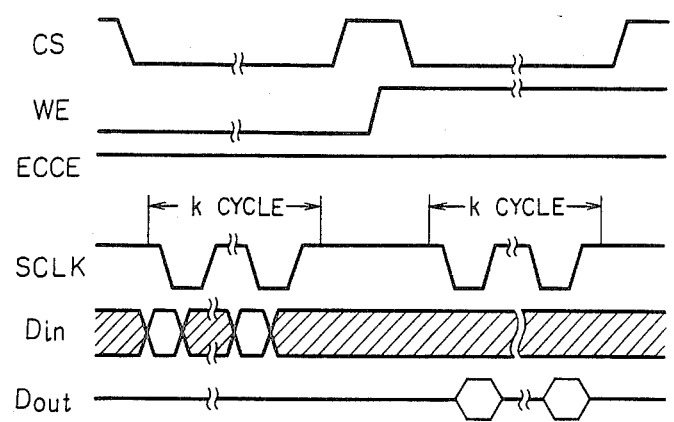
FIG. 17 is a timing chart illustrating the normal operation of the semiconductor memory of FIG. 15.

FIG. 16 is a flow chart showing the operation of the semiconductor memory of FIG. 15. FIG. 17 is a timing chart showing the normal operation of the semiconductor memory of FIG. 15.

In the semiconductor memory, if unrepresented chip select signal CS for selecting a chip is "L" and when one data line among data lines $W_0$ to $W_{r-1}$ is selected by means of the decoder 101 and the word line driver 102, and if unrepresented signal WE instructing to read or write is "L" (write), then the input/output control circuit 155 outputs a timing pulse in synchronism with signal SCLK k times to the encoding circuit 125 and shift register 107 to switch data lines $D_0, D_1, D_2, \ldots, D_{k-1}$ in this order one line after another and to write data from input terminal $D_{in}$ into the corresponding memory cells in the memory array 103 (step 1122 of FIG. 16). The switch 165 is connected to the output side (terminal C) of the encoding circuit 125.

Succeedingly, the input/output control circuit 155 outputs a timing pulse to the encoding circuit 125 and shift register m times to write m check bits generated by the encoding circuit 125 into the memory array 103 in the similar manner as above (step 1123).

By repeating the above operations, all of the data from $D_{in}$ and the check bits of an ECC are written in the memory array 103.

Alternatively, if signal WE is "H" (read), first the input/output control circuit 155 outputs a timing pulse to the shift register 107 and decoding circuit 115 to actuate them for calculation of a syndrome (step 1131). Succeedingly, the circuit 155 outputs a timing pulse in synchronism with signal SCLK to the decoding circuit 115 and shift register 107 to change data lines $D_0, D_1, D_2, \ldots, D_{k-1}$ in this order one line after another, similarly to the writing operation, and read k information bits from the corresponding memory cells of the memory array 103. After correcting an error by the decoding circuit 115, the corrected information bits are outputted to output terminal $D_{out}$. At the same time, the corrected information bits are again written in the original memory cells of the memory array 103 via terminal A of the switch 165 and data line selector 105 (step 1132 of FIG. 16).

Next, the input/output control circuit 155 outputs a timing pulse to the decoding circuit 115 and shift register 107 m times to change data lines $D_k, D_{k+1}, \ldots, D_{n-1}$ in this order one line after another, similarly to the case of the information bits and read m check bits from the corresponding memory cells. After correcting an error by the decoding circuit 115, the corrected check bits are again written in the original memory cells of the memory array 103 via terminal A of the switch 165 and data line selector 105 (step 1133). Although m check bits are again written, they are not sent to $D_{out}$.

By repeating the above readout operations, the designated information bits in the memory array 103 are outputted to $D_{out}$.

In this case, the number of cycles of signal SCLK inputted from an external circuit is k for respective writing and reading operations, and also the data to be written or read is k bits. In other words, the semiconductor memory can be considered as a k bit serial semiconductor memory and m check bits for an ECC are not readily perceived.

Figure 18:
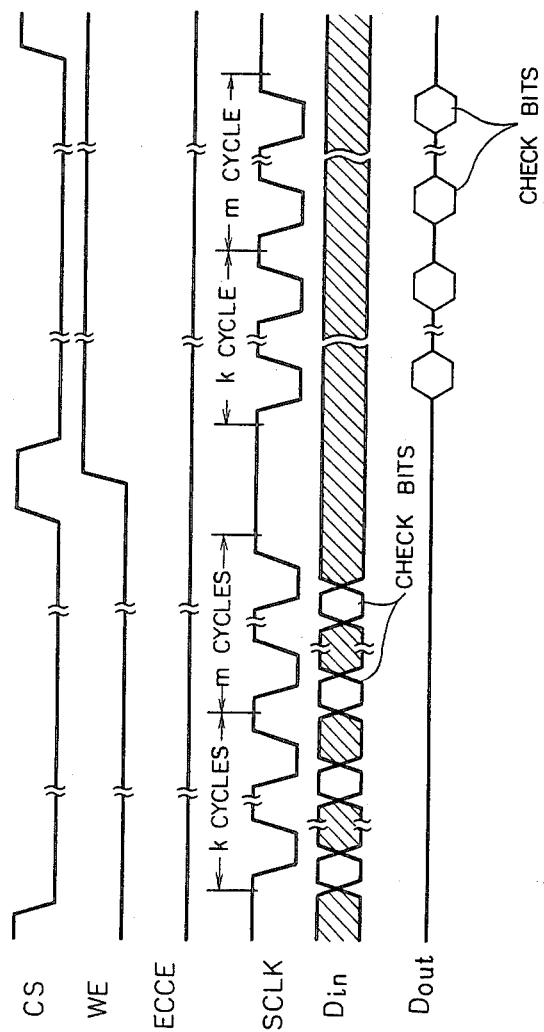
FIG. 18 is a timing chart illustrating the memory cell test operation of the semiconductor memory of FIG. 15.

FIG. 18 is a timing chart showing the testing operation of the memory cells (including those memory cells for check bits) shown in FIG. 15.

In the semiconductor memory, if both signal CS and that at terminal ECCE are "L" and when one data line among data lines $W_0$ to $W_{r-1}$ is selected, and if signal WE is "L" (write), then the input/output control outputs 155, similarly to the case of FIG. 17 (normal operation), a timing pulse in synchronism with signal SCLK k times to the encoding circuit 125 and shift register 107 to switch data lines $D_0, D_1, D_2, \ldots, D_{k-1}$ in this order, sequentially write data (information bits) from input terminal $D_{in}$ into the corresponding memory cells in the memory array 103 via terminal C of the switch 165 and data line selector 105 (step 1112 of FIG. 16).

Succeedingly, the input/output control circuit 155 outputs a timing pulse to the encoding circuit 125 and shift register 107 m times to change data lines $D_k, D_{k+1}, D_{k+2}, \ldots, D_{n-1}$ in this order to sequentially write data (check bits) from $D_{in}$ in the corresponding memory cells of the memory array 103 via terminal C of the switch 165 and data line selector 105 (step 1113).

By repeating the above operations, data (information and check bits) from $D_{in}$ is written in respective memory cells of the memory array 103.

Alternatively, if signal WE is "H" (read), first the input/output control circuit 155 instructs the shift register 107 and decoding circuit 115 to conduct a calculation of a syndrome, similarly to the case (ordinary operation) of FIG. 17, (step 1141 of FIG. 16). Succeedingly, the circuit 155 outputs a timing pulse in synchronism with signal SCLK to the decoding circuit 115 and shift register 107 to change data lines $D_0, D_1, D_2, \ldots, D_{k-1}$ in this order, similarly to the case of writing operation, and read k information bits from the corresponding memory cells of the memory array 103 to output them to $D_{out}$. At the same time, the information bits are again written in the memory array via terminal A of the switch and data line selector 105 (step 1142).

Next, the input/output control circuit 155 outputs a timing pulse to the decoding circuit 115 and shift register 107 m times to change data lines $D_k, D_{k+1}, \ldots, D_{n-1}$ in this order and read m check bits from the corresponding memory cells to output them to $D_{out}$. At the same time, the check bits are again written in the memory array 103 via terminal A of the switch 165 and data line selector 105.

By repeating the above readout operations, the information bits and check bits in the memory array 103 are outputted to $D_{out}$.

As different from the normal operation, during testing as the memory cells, signal SCLK is applied (k+m) times, respectively, for writing/reading operations and the error correction of data by the decoding circuit is inhibited (this is done by a similar method to that with FIG. 11). By applying signal SCLK n (=k+m) times, not only information bits written in the memory cells, but also check bits, can be read out to $D_{out}$ without correction, thereby enabling testing of the memory cells themselves (including those memory cells for check bits). Furthermore, in such a case, the semiconductor memory can be perceived as an n bit serial semiconductor memory without an error correcting function.

Figure 19:
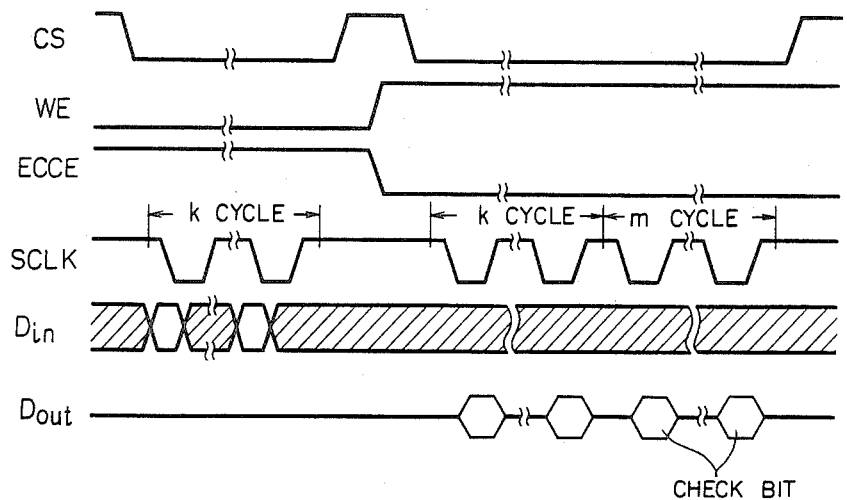
FIG. 19 is a timing chart illustrating the encoding test operation of the semiconductor memory of FIG. 15.

FIG. 19 is a timing chart showing the operation of the encoding test.

In the semiconductor memory, if signal CS is "L", the signal at terminal ECCE is "H", and signal WE is "L" (write), and when one word line among word lines $W_0$ to $W_{r-1}$ is selected, data (information bits) from $D_{in}$ is written, similarly to the case (normal operation) of FIG. 17, in the memory array 103 in response to timing pulses (k times) synchronizing with signal SCLK (step 1122). Succeedingly, in response to timing pulses (m times), m check bits generated by the encoding circuit 125 are written in the memory array 103 (step 1123).

By repeating the above operations, all data from $D_{in}$ and the corresponding check bits for an ECC are written in the memory array 103.

Alternatively, if the signal at terminal ECCE is "L" and signal WE is "H" (read), and when one word line among word lines $W_0$ to $W_{r-1}$ is selected, k information bits in the memory array 103 are read and outputted to $D_{out}$, after the calculation of a syndrome in response to timing pulses (k times) synchronizing with signal SCLK, similarly to the case (memory cell testing) of FIG. 18. At the same time, the information bits are again written in the memory array (steps 1141 and 1142). Succeedingly, similar to the information bits, m check bits are read and outputted to $D_{out}$ in response to timing pulses (m times) synchronizing with signal SCLK and at the same time they are again written in the memory array 103 (step 1143).

By repeating the above operations, the information and check bits in the memory array 103 are read and outputted to $D_{out}$.

In the above case, after setting the signal at ECCE at "H" and writing the information bits together with the check bits added thereto by the encoding circuit 125, n bit data including the information and check bits are read without error correction by setting the signal at ECCE at "L" (inhibition of error correcting function). Therefore, it is possible to test if the check bits have been correctly added by the encoding circuit 125.

Figure 20:
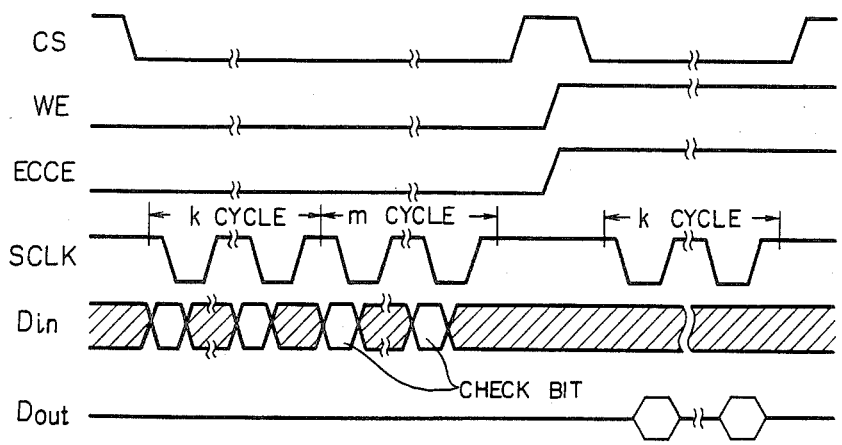
FIG. 20 is a timing chart illustrating the decoding test operation of the semiconductor memory of FIG. 15.

FIG. 20 is a timing chart showing the operation of the decoding test.

In the semiconductor memory, if both the signal CS and the signal at ECCE are "L" and signal WE is "L" (write), data (k information bits) from $D_{in}$ is written, similarly to the case (memory cell testing) of FIG. 18, in the memory cells of the memory array 103 in response to timing pulses (k times) synchronizing with signal SCLK (step 1112). Succeedingly, in response to timing pulses (m times), data from $D_{in}$ (m check bits) is sequentially written in the memory cells (step 1113).

Alternatively, if signal WE is "H" (read), k information bits in the memory array 103 are read out of the memory array 103, after the calculation of a syndrome in response to timing pulses (k times) synchronizing with signal SCLK, similarly to the case (normal operation) of FIG. 17 and outputted to $D_{out}$ after error-correction by the decoding circuit 115. At the same time they are again written in the memory cells (steps 1131 and 1132). Succeedingly, m check bits are read from the memory array 103 and they are again written in the memory cells after error-correction by the decoding circuit 115 (step 1133).

By repeating the above operations, the information bits in the memory array 103 are read and outputted to $D_{out}$.

Figure 21:
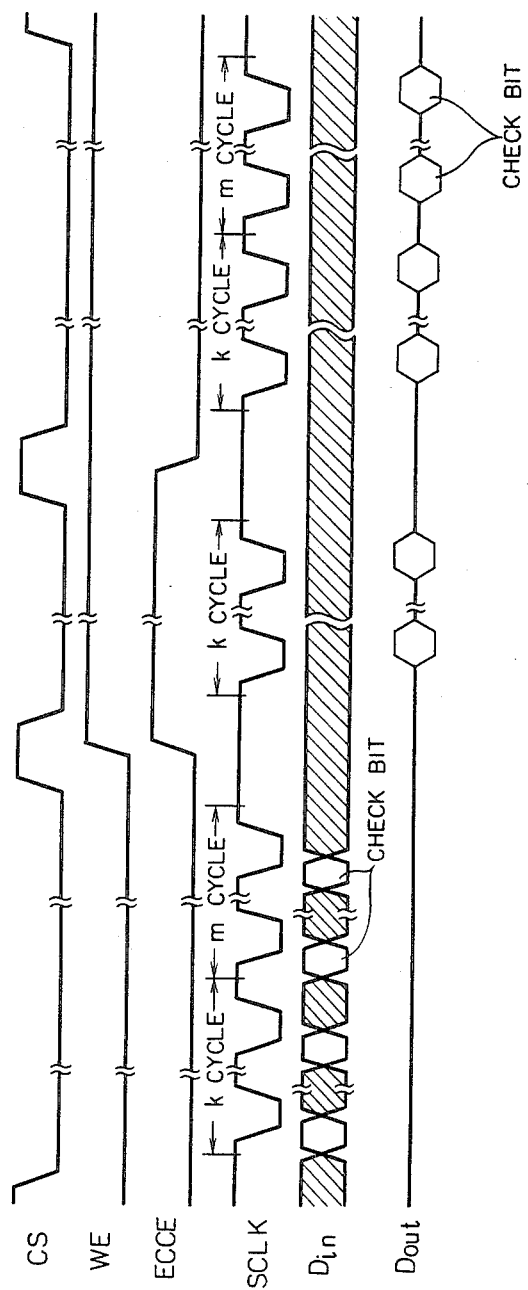
FIG. 21 is a timing chart illustrating the information bit correcting test together with the check bit correcting test of the semiconductor memory of FIG. 15.

In the above case, after setting the signal at ECCE at "L" and writing the information bits together with the check bits in the memory array 103, the information bits are read by error-correcting by the decoding circuit, i.e., by setting the signal at ECCE at "H". Therefore, it is possible to test if the information bits have been corrected by the decoding circuit 115. The content of test data to be written is arranged to include therein an error correctable by the decoding circuit 115. If the check bit test is to be conducted together with the correction test of information bits, the method as illustrated in FIG. 21 will be used.

In particular, in the semiconductor memory, at a first step that signal CS, terminal ECCE and signal WE are all at an "L" state, both k information bits from $D_{in}$ and m check bits are written, similarly to the case of FIG. 20, in the memory cells in response to timing pulses (k+m times) (steps 1112 to 1113).

Next, when terminal ECCE and signal WE are both at an "H" state, information bits are read from the memory array 103 and corrected to output to $D_{out}$, after the calculation of a syndrome in response to timing pulses (k times) synchronizing with signal SCLK, similarly to the case of FIG. 20. Thereafter, the check bits are read and corrected in response to timing pulses (m times) and are again written into the memory array 103 (steps 1131 to 1133).

Succeedingly, when both signal CS and terminal ECCE are at "L" and signal WE is at "H", similarly to the case of FIG. 18, information bits are read to output them to $D_{out}$, after the calculation of a syndrome in response to timing pulse (k times) synchronizing with signal SCLK, and are again written into the memory array 103. Thereafter, in response to timing pulses (m times), the check bits corrected at the second step are read out to output them to $D_{out}$ and are also written into the memory array 103 (steps 1141 to 1143).

With the above three steps, it is possible to judge if the check bits have been corrected. A method without employing the three step operations will be described with reference to FIG. 22.

Figure 22:
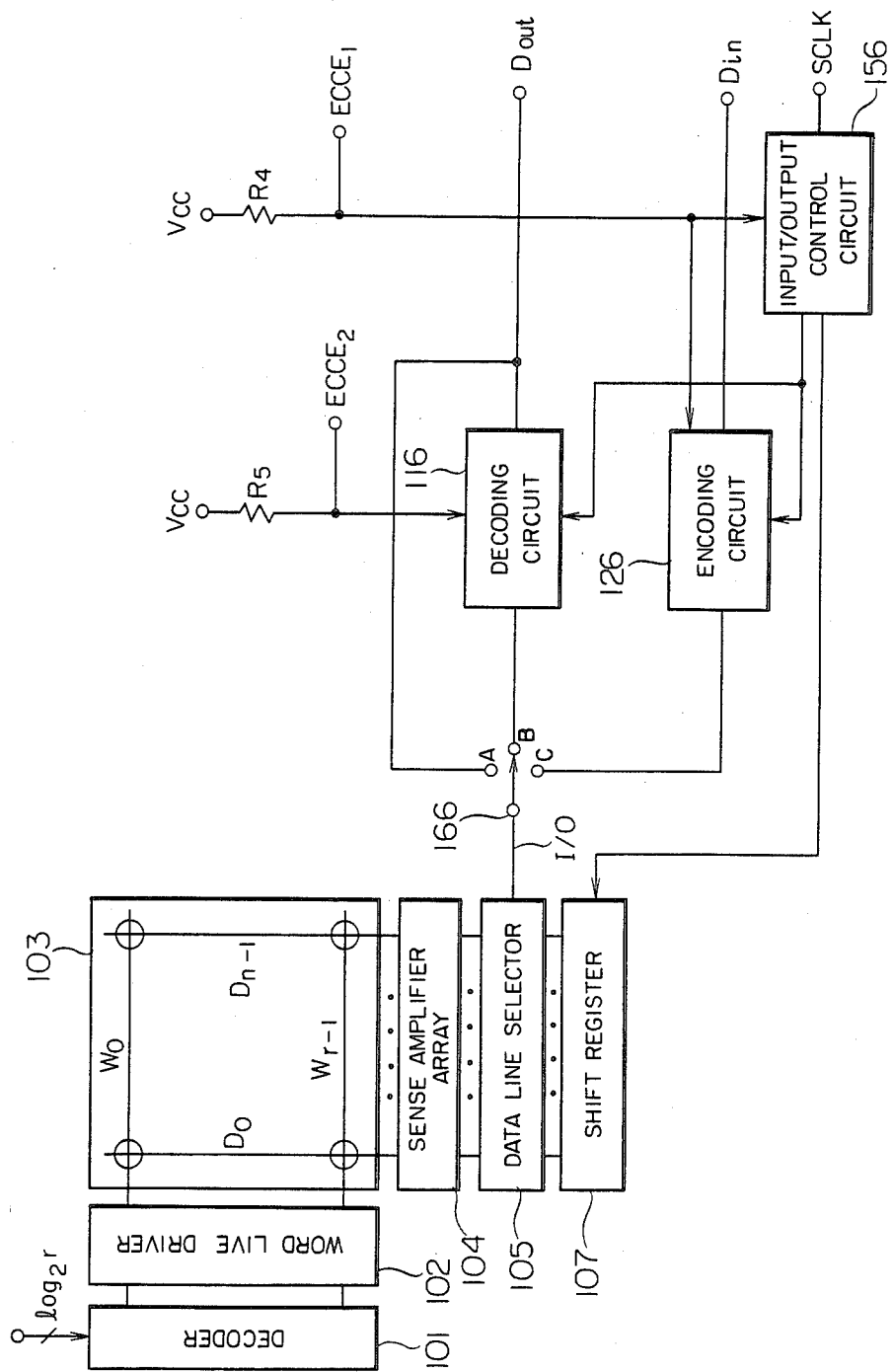
FIG. 22 is a circuit block diagram showing a sixth embodiment of the semiconductor memory according to the present invention, wherein two input terminals for an ECC enable signal are provided.

FIG. 22 is a circuit diagram showing the sixth embodiment of the semiconductor memory provided with two input terminals for an ECC enable signal.

In the figure, terminal $ECCE_1$ is for controlling an input/output control circuit 156 and encoding circuit 126 in a similar manner as described above. Terminal $ECCE_2$ is for controlling a decoding circuit 116 in a similar manner as described above. The other circuit elements are the same as those in FIG. 15.

In detail, in a decoding test of check bits, first, similar to the case (decoding test) of FIG. 20, signal CS, terminal $ECCE_1$ and signal WE are all set at "L" (logic "0") and terminal $ECCE_2$ is set at "H" (logic "1"). Then, data from $D_{in}$ (information and check bits) are written in the memory array 103 and the succeeding readout is conducted by setting terminal $ECCE_1$ at a logic "0" and terminal $ECCE_2$ at a logic "1". Thus, the check bits can be read directly during the error correction by the decoding circuit 116, thereby enabling the check bit correction by two steps as above. During other tests and during a normal operation, similar operations to those with the embodiment of FIG. 15 are performed assuming that $ECCE_1 = ECCE_2$.

Figure 23:
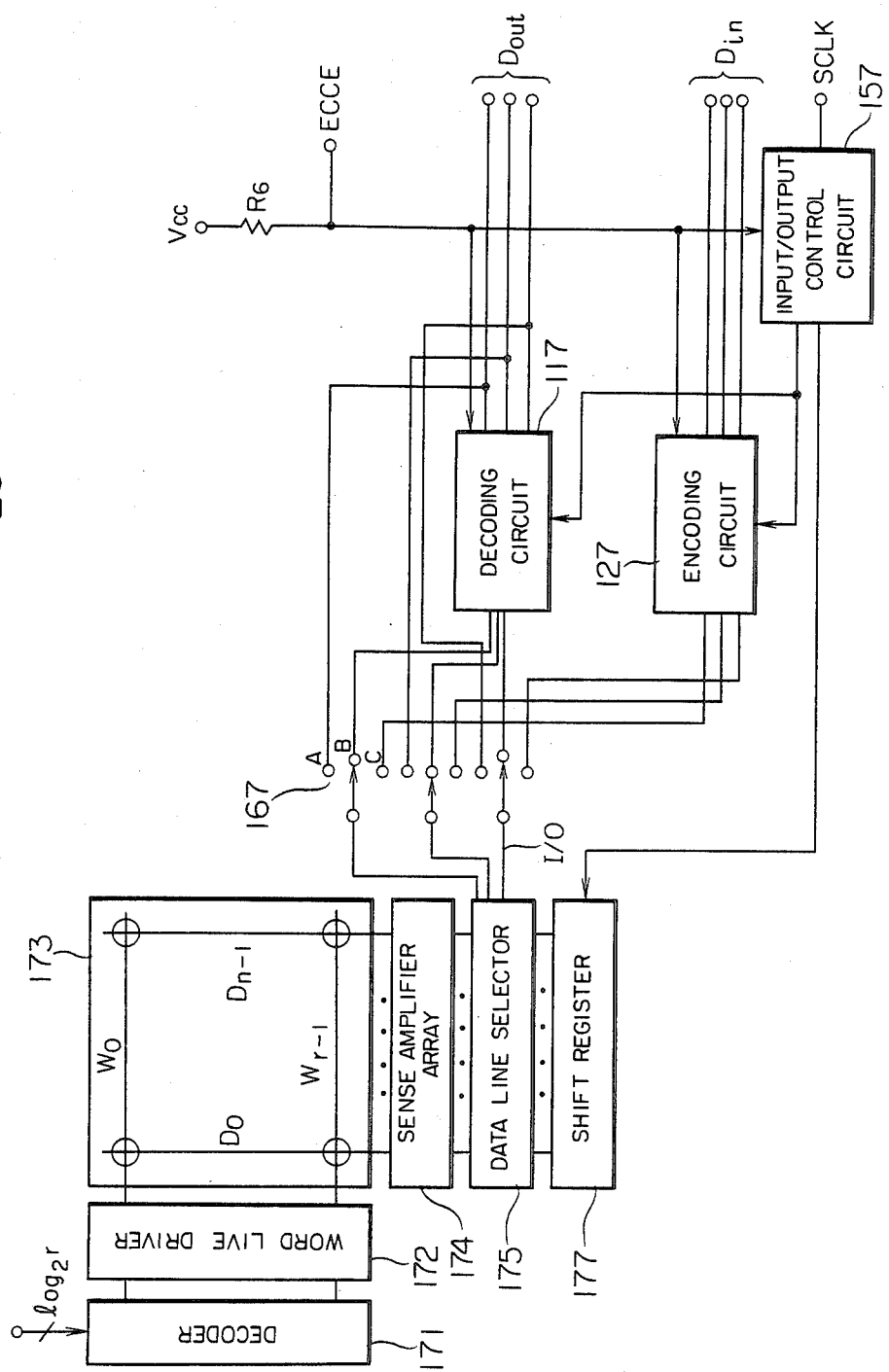
FIG. 23 is a circuit block diagram showing a seventh embodiment of the semiconductor memory according to the present invention.

FIG. 23 is a circuit diagram showing the seventh embodiment of the semiconductor memory, wherein a multi-level data storage memory disclosed in Japanese Unexamined Patent Publication No. 60-13398, is used. In the figure, reference numeral 173 represents a memory matrix for multi-level data (ex. 3 bits), and reference numeral 167 represents a switch for switching three I/O lines from a data line selector 175 respectively to the input and output sides of a decoding circuit 117 and to the output side of an encoding circuit 127. Although respective three input and output terminals $D_{in}$ and $D_{out}$ are used, the operations of the other circuits are basically similar to those of FIG. 15.

The encoding circuit 127 encodes respective three bits in a similar manner as described previously and writes the encoded bits into the multi-level memory. The decoding circuit 117 error-corrects respective three bits in a similar manner as described previously and the error-corrected bits are read from the multi-level memory. Thus, various tests previously described are performed.

As seen from the above description, the input/output of the ECC enable signal and check bits to or from an external circuit can be notified so that independent tests are possible, such as a test for memory cells per se storing check bits for an ECC, a test for an encoding circuit, or a test for a decoding circuit. Therefore, the reliability of testing is improved as compared with a conventional one.

As described, according to the present invention, in a semiconductor memory having a built-in error correcting function, writing in the memory cells for storing check bits for an ECC is performed using input data from terminal $D_{in}$ or data generated by an encoding circuit. On the contrary, reading data from the memory array is performed by switching between the operation and non-operation of error correction by a decoding circuit and by switching between the output and non-output of check bits. As a result, independent tests are possible, such as a test for memory cells for check bits, a test for the encoding circuit and a test for the decoding circuit.

We claim:

1. A semiconductor memory having a data correcting function using an error correcting code, comprising:
   a random access memory;
   means for providing an address for said random access memory and a timing signal to control sequence of read and write operations to said random access memory;
   control means responsive to said timing signal for providing a completion signal indicative of completion of a data writing operation;
   means responsive to an output of said control means for counting up to a predetermined count and for providing a count-up signal to said control means to cause said control means to provide a signal indicative of completion of a data reading operation when said random access means is under a read mode.

2. A semiconductor memory according to claim 1, wherein said random access memory is capable of serial data reading and serial data writing in synchronism with a clock pulse.

3. A semiconductor memory according to claim 1, wherein said error correcting code is a cyclic code or a shortened cyclic code.

4. A semiconductor memory according to claim 2, wherein said error correcting code is a cyclic code or a shortened cyclic code.

5. A semiconductor memory having a data correcting function using an error correcting code, comprising:
   a random access memory;
   means for providing an address for said random access memory and a timing signal to control a sequence of read and write operations to said random access memory;
   control means responsive to at least one of said timing signal and a count signal for causing a switching means to switch between two input pulse sources; and
   counter means for counting pulses from said two input pulse sources and for causing said control circuit to output a signal indicative of completion of a read or write operation based on a predetermined count value.

6. A semiconductor memory having a data correction function using an error correcting code according to claim 5, wherein said control means substantially immediately outputs a preparation completion signal in response to said timing signal when said semiconductor memory is performing a data write operation.

7. A semiconductor memory having a data correction function using an error correcting code according to claim 5, wherein said control means outputs a preparation completion signal in response to said timing signal after a delay corresponding to a predetermined count from said counter means, when said semiconductor memory is performing a data read operation.

8. A semiconductor memory having an error correcting function comprising:

a memory array means;

encoding means for adding check bits to a data array in accordance with an error correcting code;

decoding means for correcting said data array including said check bits;

address signal generation means for generating an address signal; and error correction enabling means for enabling said error correcting function of said semiconductor memory such that said error correcting function of each of said memory array means, said encoding means and said decoding means can be tested independently of each based on outputs of said address signal generation means and said error correction enabling means.

9. A semiconductor memory according to claim 8, wherein said address signal generation means generates an address signal for selecting a bit to be read or written from a series of check bits and said semiconductor memory is a random access memory.

10. A semiconductor memory according to claim 8, wherein said address signal generation means reads and writes said check bits in response to a clock signal in a manner similar to the reading and writing of data bits.

11. A semiconductor memory according to claim 8, wherein said address signal generation means and said error correction enabling means are provided in a multilevel memory.

12. A semiconductor memory having an error correcting operation using an error correcting code including check bits comprising:

a memory array means;

address signal generation means for producing an address signal;

means for inputting an error correcting enable signal for enabling said error correcting operation;

writing circuit means for replacing one bit of said data bits and said check bits with an input data bit based on an ouptut of said address generation means and said means for inputting an error correcting code enable signal;

encoding means for generating check bits for said error correction code based on an output of said address signal generation means; and decoding means for correcting errors in data bits from said memory array means, wherein the error correction function of each of said memory array means, said encoding means, and said decoding means can be tested independently of each other based upon outputs of said address signal generation means and said error correction enabling means.

* * * * *